United States Patent
Nakashima et al.

(10) Patent No.: US 12,283,495 B2
(45) Date of Patent: Apr. 22, 2025

(54) SUBSTRATE PROCESSING APPARATUS AND SUBSTRATE PROCESSING METHOD

(71) Applicant: Tokyo Electron Limited, Tokyo (JP)

(72) Inventors: Mikio Nakashima, Kumamoto (JP); Shota Umezaki, Kumamoto (JP); Hiroaki Inadomi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 645 days.

(21) Appl. No.: 17/645,779

(22) Filed: Dec. 23, 2021

(65) Prior Publication Data
US 2022/0208567 A1   Jun. 30, 2022

(30) Foreign Application Priority Data
Dec. 24, 2020   (JP) .................................. 2020-215410

(51) Int. Cl.
*H01L 21/67*  (2006.01)
*B08B 3/02*   (2006.01)
*B08B 3/08*   (2006.01)
*F26B 5/00*   (2006.01)
*H01L 21/02*  (2006.01)

(52) U.S. Cl.
CPC ........ *H01L 21/67034* (2013.01); *F26B 5/005* (2013.01); *H01L 21/02101* (2013.01); *B08B 3/022* (2013.01); *B08B 3/08* (2013.01)

(58) Field of Classification Search
CPC ............... F26B 5/005; H01L 21/67034; H01L 21/02101; H01L 21/67017; H01L 21/6704; H01L 21/02057; B08B 3/022; B08B 3/08
See application file for complete search history.

(56) References Cited

U.S. PATENT DOCUMENTS

2013/0318812 A1* 12/2013 Kim .................. H01L 21/67017
                                                34/201
2021/0125840 A1*  4/2021 Yoshida ................ H01L 21/304

FOREIGN PATENT DOCUMENTS

| JP | 2003-031533 A | 1/2003 |
| JP | 2013-251550 A | 12/2013 |
| JP | 2018-081966 A | 5/2018 |
| JP | 2020-053518 A | 4/2020 |

* cited by examiner

*Primary Examiner* — Jessica Yuen
(74) *Attorney, Agent, or Firm* — Chrisman Gallo Tochtrop LLC

(57) ABSTRACT

A substrate processing apparatus includes a processing vessel; and a processing fluid supply configured to supply a processing fluid in a supercritical state into the processing vessel. The processing fluid supply includes a fluid supply line; a cooling device provided in the fluid supply line, and configured to cool the processing fluid in a gas state to produce the processing fluid in a liquid state; a pump positioned downstream of the cooling device; a heating device positioned downstream of the pump, and configured to heat the processing fluid in the liquid state to generate the processing fluid in the supercritical state; a first flow rate adjuster positioned between the pump and the heating device, and configured to adjust a supply flow rate of the processing fluid supplied to the processing vessel; and a controller configured to control the first flow rate adjuster.

9 Claims, 12 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-215410 filed on Dec. 24, 2020, the entire disclosure of which is incorporated herein by reference.

TECHNICAL FIELD

The various aspects and embodiments described herein pertain generally to a substrate processing apparatus and a substrate processing method.

BACKGROUND

In a semiconductor device manufacturing process for forming a stacked structure of an integrated circuit on a surface of a substrate such as a semiconductor wafer (hereinafter, simply referred to as a wafer), a liquid processing such as chemical liquid cleaning or wet etching is performed. Recently, when removing a liquid or the like adhering to the surface of the wafer through such a liquid processing, a drying method using a processing fluid in a supercritical state is used.

Patent Document 1 discloses a substrate processing apparatus in which a fluid supply tank is connected to a processing vessel through a supply line.

Patent Document 1: Japanese Patent Laid-open Publication No. 2018-081966

SUMMARY

In one exemplary embodiment, a substrate processing apparatus includes a processing vessel having a processing space in which a substrate whose surface is wet by a liquid is allowed to be accommodated; and a processing fluid supply configured to supply a processing fluid in a supercritical state into the processing vessel toward the liquid. The processing fluid supply includes a fluid supply line having a first end connected to a fluid source and a second end connected to the processing vessel; a cooling device provided in the fluid supply line, and configured to cool the processing fluid in a gas state to produce the processing fluid in a liquid state; a pump provided in the fluid supply line to be positioned downstream of the cooling device; a heating device provided in the fluid supply line to be positioned downstream of the pump, and configured to heat the processing fluid in the liquid state to generate the processing fluid in the supercritical state; a first flow rate adjuster provided in the fluid supply line to be positioned between the pump and the heating device, and configured to adjust a supply flow rate of the processing fluid supplied to the processing vessel; and a controller configured to control the first flow rate adjuster.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
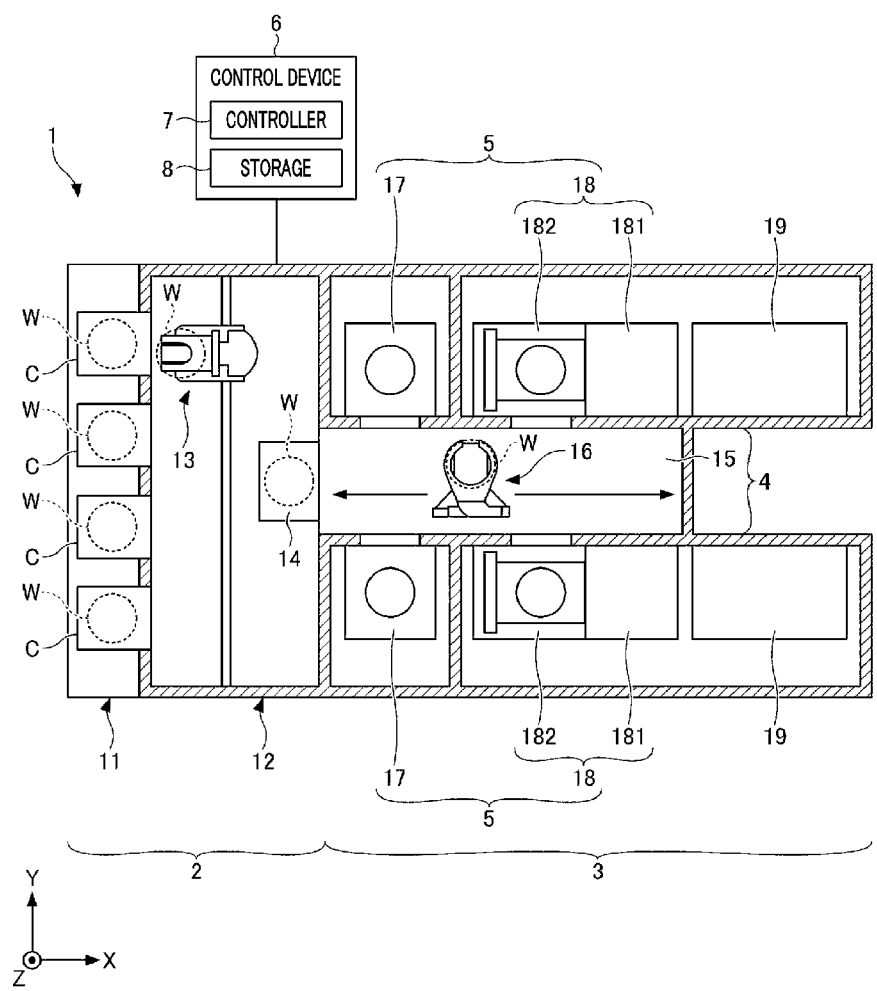
FIG. 1 is a diagram illustrating a configuration example of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing system and a processing fluid supply method according to the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

<Configuration of Substrate Processing Apparatus>

First, a configuration of a substrate processing apparatus 1 according to an exemplary embodiment will be described with reference to FIG. 1. FIG. 1 is a diagram illustrating a configuration example of the substrate processing apparatus 1 according to the exemplary embodiment. In the following, in order to clarify positional relationships, the X-axis, Y-axis and Z-axis which are orthogonal to each other will be defined, and the positive Z-axis direction will be regarded as a vertically upward direction As depicted in FIG. 1, the substrate processing apparatus 1 is equipped with a carry-in/out station 2 and a processing station 3. The carry-in/out station 2 and the processing station 3 are provided adjacent to each other.

The carry-in/out station 2 is provided with a carrier placing section 11 and a transfer section 12. A plurality of carriers C each accommodating therein a multiple number of semiconductor wafers W (hereinafter, referred to as "wafers W") horizontally is placed in the carrier placing section 11.

The transfer section 12 is provided adjacent to the carrier placing section 11. A transfer device 13 and a delivery unit 14 are disposed in the transfer section 12.

The transfer device 13 is equipped with a wafer holding mechanism configured to hold the wafer W. Further, the transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 includes a transfer block 4, a plurality of processing blocks 5, and a plurality of supply units 19.

The transfer block 4 includes a transfer area 15 and a transfer device 16. The transfer area 15 is a rectangular parallelepiped-shaped area extending in an arrangement direction (X-axis direction) of the carry-in/out station 2 and the processing station 3. The transfer device 16 is disposed in the transfer area 15.

The transfer device 16 is equipped with a wafer holding mechanism configured to hold the wafer W. The transfer device 16 is movable horizontally and vertically and pivotable around a vertical axis, and transfers the wafers W between the delivery unit 14 and the plurality of processing blocks 5 by using the wafer holding mechanism.

The plurality of processing blocks 5 are disposed adjacent to the transfer area 15 on both sides of the transfer area 15. Specifically, the plurality of processing blocks 5 are disposed at one side (positive Y-axis side) and the other side (negative Y-axis side) of the transfer area 15 in a direction (Y-axis direction) perpendicular to the arrangement direction (X-axis direction) of the carry-in/out station 2 and the processing station 3.

Further, although not shown, the plurality of processing blocks 5 are arranged in multiple levels (for example, three levels) along a vertical direction. The transfer of the wafer W between the processing block 5 disposed at each level and the delivery unit 14 is performed by the single transfer device 16 disposed in the transfer block 4. Here, the number of the levels of the plurality of processing blocks 5 is not limited to the three.

Each processing block 5 is equipped with a liquid processing unit 17 and a drying unit 18. The drying unit 18 is an example of a substrate processing unit.

The liquid processing unit 17 performs a cleaning processing of cleaning a top surface of the wafer W, which is a pattern formation surface. Further, the liquid processing unit 17 performs a liquid film forming processing of forming a liquid film on the top surface of the wafer W after being subjected to the cleaning processing. A configuration of the liquid processing unit 17 will be described later.

The drying unit 18 performs a supercritical drying processing on the wafer W after being subjected to the liquid film forming processing. Specifically, the drying unit 18 dries the wafer W by bringing the wafer W after being subjected to the liquid film forming processing into contact with a processing fluid in a supercritical state (hereinafter, also referred to as "supercritical fluid"). A configuration of the drying unit 18 will be described later.

The liquid processing unit 17 and the drying unit 18 are arranged along the transfer area 15 (that is, along the X-axis direction). The liquid processing unit 17 is disposed closer to the carry-in/out station 2 than the drying unit 18.

In this way, each processing block 5 is equipped with one liquid processing unit 17 and one drying unit 18. That is, the substrate processing apparatus 1 is provided with the same number of liquid processing units 17 and drying units 18.

Further, the drying unit 18 includes a processing area 181 where the supercritical drying processing is performed and a delivery area 182 where the wafer W is delivered between the transfer block 4 and the processing area 181. The processing area 181 and the delivery area 182 are arranged along the transfer area 15.

Specifically, the delivery area 182 is disposed closer to the liquid processing unit 17 than the processing area 181. That is, in each processing block 5, the liquid processing unit 17, the delivery area 182, and the processing area 181 are arranged in this order along the transfer area 15.

One supply unit 19 is provided for three processing blocks 5. For example, one supply unit 19 is provided for the three processing blocks 5 stacked in the vertical direction.

The supply unit 19 supplies the processing fluid to the drying unit 18. Specifically, the supply unit 19 includes a supply device group including a flowmeter, a flow rate adjuster, a backpressure valve, a heater, and so forth; and a housing accommodating the supply device group therein. In the present exemplary embodiment, the supply unit 19 supplies $CO_2$ to the drying unit 18 as the processing fluid. A configuration of the supply unit 19 will be elaborated later. The processing fluid can be supplied from the one supply unit 19 to the three processing blocks 5.

As depicted in FIG. 1, the substrate processing apparatus 1 includes a control device 6. The control device 6 is, for example, a computer, and includes a controller 7 and a storage 8.

The controller 7 includes various types of circuits and a microcomputer having a CPU (Central Processing Unit), a ROM (Read Only Memory), a RAM (Random Access Memory), an input/output port, and so forth. The CPU of the microcomputer reads and executes a program stored in the ROM, thus carrying out control over the transfer devices 13 and 16, the liquid processing units 17, the drying units 18, the supply units 19, and so forth.

Further, such a program may be recorded on a computer-readable recording medium and may be installed from this recording medium to the storage 8 of the control device 6. The computer-readable recording medium may be, by way of example, but not limitation, a hard disk HD, a flexible disk FD, a compact disk CD, a magnet optical disk MO, a memory card, or the like.

The storage 8 may be implemented by, for example, a semiconductor memory device such as a RAM or a flash memory, or a storage device such as a hard disk or an optical disk.

In the substrate processing apparatus 1 configured as described above, the transfer device 13 of the carry-in/out station 2 takes out the wafer W from the carrier C disposed in the carrier placing section 11, and transfers the taken wafer W to the delivery unit 14. The wafer W placed in the delivery unit 14 is then taken out of the delivery unit 14 by the transfer device 16 of the processing station 3 and carried into the liquid processing unit 17.

The wafer W carried into the liquid processing unit 17 is subjected to the cleaning processing and the liquid film forming processing by the liquid processing unit 17 and, then, carried out of the liquid processing unit 17 by the transfer device 16. The wafer W taken out from the liquid processing unit 17 is carried into the drying unit 18 by the transfer device 16, and the drying processing is performed by the drying unit 18.

The wafer W dried by the drying unit 18 is carried out of the drying unit 18 by the transfer device 16 and placed in the delivery unit 14. Then, the wafer W placed in the delivery unit 14, which is finished with all the required processings, is returned back into the carrier C in the carrier placing section 11 by the transfer device 13.

<Configuration of Liquid Processing Unit>

Figure 2:
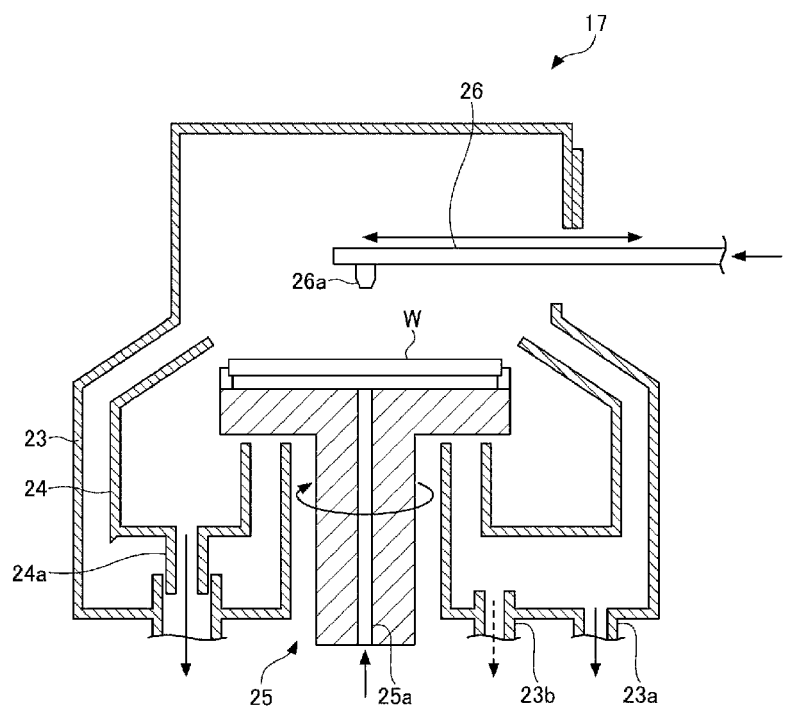
FIG. 2 is a diagram illustrating a configuration example of a liquid processing unit.

Now, the configuration of the liquid processing unit 17 will be explained with reference to FIG. 2. FIG. 2 is a diagram illustrating a configuration example of the liquid processing unit 17. The liquid processing unit 17 is configured as a single-wafer cleaning apparatus configured to clean the wafers W one by one by, for example, spin cleaning.

As shown in FIG. 2, the liquid processing unit 17 holds the wafer W substantially horizontally with a wafer holding mechanism 25 disposed in an outer chamber 23 forming a processing space, and rotates the wafer W by rotating this wafer holding mechanism 25 around a vertical axis.

Then, the liquid processing unit 17 advances a nozzle arm 26 to above the wafer W being rotated, and supplies a chemical liquid and a rinse liquid from a chemical liquid nozzle 26a provided at a leading end of the nozzle arm 26 in a predetermined order, thus cleaning the top surface of the wafer W.

Further, in the liquid processing unit 17, a chemical liquid supply path 25a is formed within the wafer holding mechanism 25. A bottom surface of the wafer W is also cleaned by the chemical liquid and the rinse liquid supplied from the chemical liquid supply path 25a.

In the cleaning processing, particles and organic contaminants are first removed by, for example, a SC1 solution (a mixture of ammonia and hydrogen peroxide) which is an alkaline chemical liquid. Next, rinsing is performed by deionized water (hereinafter, simply referred to as "DIW") which is used as the rinse liquid.

Subsequently, a natural oxide film is removed by a diluted hydrofluoric acid solution (hereinafter, referred to as "DHF") which is an acidic chemical liquid, and rinsing by the DIW is then performed.

The aforementioned various kinds of chemical liquids are received by the outer chamber 23 and an inner cup 24 disposed in the outer chamber 23, and drained from a drain port 23a provided at a bottom of the outer chamber 23 and a drain port 24a provided at a bottom of the inner cup 24. Further, an atmosphere within the outer chamber 23 is exhausted from an exhaust port 23b provided at the bottom of the outer chamber 23.

The liquid film forming processing is performed after the rinsing in the cleaning processing. To elaborate, the liquid processing unit 17 supplies IPA (IsoPropyl Alcohol) in a liquid state (hereinafter, also referred to as "IPA liquid") to the top surface and the bottom surface of the wafer W while rotating the wafer holding mechanism 25. Accordingly, the DIW remaining on both surfaces of the wafer W is replaced with the IPA. Thereafter, the liquid processing unit 17 gently stops the rotation of the wafer holding mechanism 25.

The wafer W after being subjected to the liquid film forming processing is transferred to the transfer device 16 by a non-illustrated transfer mechanism provided at the wafer holding mechanism 25 with a liquid film of the IPA liquid formed on the top surface thereof, and is then carried out of the liquid processing unit 17.

The liquid film formed on the wafer W suppresses pattern collapse that might be caused by evaporation (vaporization) of the liquid on the top surface of the wafer W during a transfer of the wafer W from the liquid processing unit 17 to the drying unit 18 and during a carrying-in operation into the drying unit 18.

<Configuration of Drying Unit>

Figure 3:
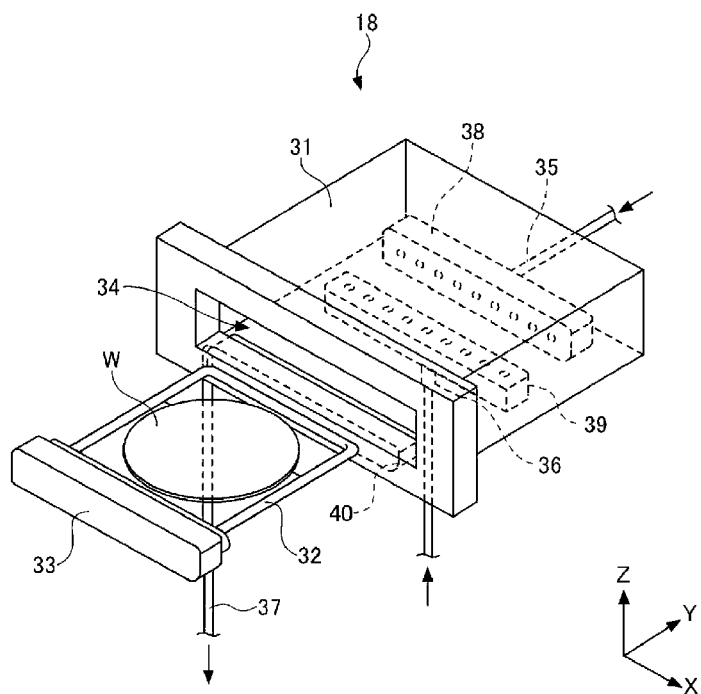
FIG. 3 is a schematic perspective view illustrating a configuration example of a drying unit.
Figure 4:
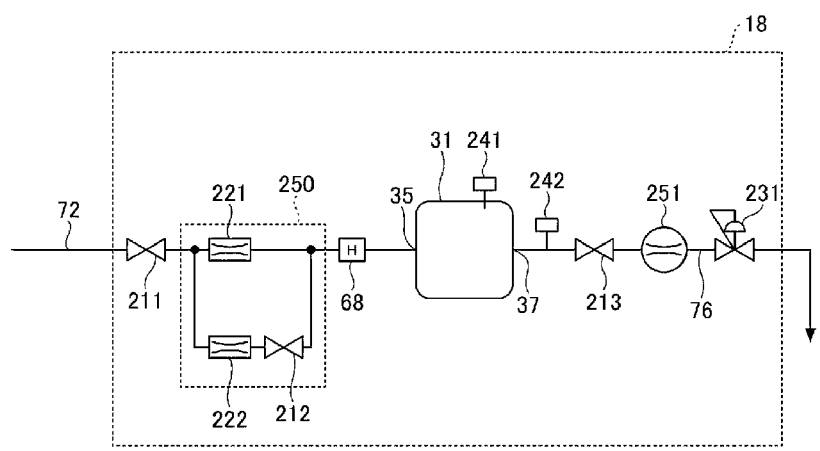
FIG. 4 is a diagram illustrating the configuration example of the drying unit.

Now, the configuration of the drying unit 18 will be explained with reference to FIG. 3 and FIG. 4. FIG. 3 is a schematic perspective view illustrating a configuration example of the drying unit 18. FIG. 4 is a diagram illustrating the configuration example of the drying unit 18.

As illustrated in FIG. 3, the drying unit 18 has a main body 31, a holding plate 32, and a cover member 33. The main body 31 having a housing shape is provided with an opening 34 through which the wafer W is carried in or out. The holding plate 32 is configured to horizontally hold the wafer W as a processing target. The cover member 33 is configured to support the holding plate 32 and seal the opening 34 when the wafer W is carried into the main body 31. The main body 31 is an example of a processing vessel.

The main body 31 is, for example, a container having therein a processing space in which a wafer W having a diameter of 300 mm can be accommodated, and supply ports 35 and 36 and a drain port 37 are provided in walls of the main body 31. The supply ports 35 and 36 and the drain port 37 are respectively connected to supply flow paths and a drain flow path for flowing the supercritical fluid to the drying unit 18.

The supply port 35 is connected to a side surface of the housing-shaped main body 31 opposite to a side surface where the opening 34 is provided. Further, the supply port 36 is connected to a bottom surface of the main body 31. Furthermore, the drain port 37 is connected to a portion of the main body 31 under the opening 34. Here, although the two supply ports 35 and 36 and the one drain port 37 are illustrated in FIG. 3, the number of the supply ports 35 and 36 and the number of the drain port 37 are not particularly limited.

Further, fluid supply headers 38 and 39 and a fluid drain header 40 are provided within the main body 31. The fluid supply headers 38 and 39 are provided with a plurality of supply openings arranged in the lengthwise direction of the fluid supply headers 38 and 39, and the fluid drain header 40 is provided with a plurality of drain openings arranged in the lengthwise direction of the fluid drain header 40.

The fluid supply header 38 is connected to the supply port 35. Within the housing-shaped main body 31, the fluid supply header 38 is provided adjacent to the side surface opposite to the opening 34. Further, the plurality supply openings formed at the fluid supply header 38 face the opening 34 side.

The fluid supply header 39 is connected to the supply port 36. Within the housing-shaped main body 31, the fluid supply header 39 is provided at a central portion of a bottom surface of the housing-shaped main body 31. In addition, the plurality of supply openings formed at the fluid supply header 39 are facing upwards.

The fluid drain header 40 is connected to the drain port 37. Within the housing-shaped main body 31, the fluid drain header 40 is provided adjacent to the side surface where the opening 34 is provided and is positioned under the opening 34. Further, the plurality of drain openings formed at the fluid drain header 40 are facing upwards.

The fluid supply headers 38 and 39 supply the supercritical fluid into the main body 31. Further, the fluid drain header 40 guides and drains the supercritical fluid within the main body 31 to the outside of the main body 31. Further, the supercritical fluid drained to the outside of the main body 31 through the fluid drain header 40 includes the IPA liquid dissolved into the supercritical fluid from the surface of the wafer W.

As shown in FIG. 4, a second supply line 72 of the supply unit 19 is connected to the drying unit 18. The second supply line 72 is branched off into two supply lines (not shown in FIG. 4) within the drying unit 18. One of these two supply lines is connected to the supply port 35, and the other is connected to the supply port 36 (not shown in FIG. 4). The second supply line 72 is provided with a valve 211, a first flow rate adjuster 250, and a heater 68 that are arranged in sequence from the upstream side (supply unit 19 side).

The valve 211 is configured to adjust on and off of a flow of the processing fluid. In the opened state, the valve 211 allows the processing fluid to flow to the second supply line 72 on the downstream side. In the closed state, on the other hand, the valve 211 does not allow the processing fluid to flow to the second supply line 72 on the downstream side.

The first flow rate adjuster 250 includes an orifice 221, an orifice 222 connected in parallel to the orifice 221, and a valve 212 connected in series to the orifice 222, and serves to adjust a supply flow rate of the processing fluid to be supplied to the main body 31.

The orifices 221 and 222 serve to adjust a pressure of the processing fluid by reducing a flow rate of the processing fluid in a gas state or a liquid state supplied from the supply unit 19 through the valve 211. The orifices 221 and 222 are capable of allowing the pressure-adjusted processing fluid to flow to the second supply line 72 on the downstream side. The orifice 221 is an example of a first diaphragm, and the orifice 222 is an example of a second diaphragm.

The valve 212 is configured to adjust on and off of the flow of the processing fluid. In an opened state, the valve 212 allows the processing fluid to flow to the second supply line 72 on the downstream side. In a closed state, on the other hand, the valve 212 does not allow the processing fluid to flow to the second supply line 72 on the downstream side. The valve 212 is an example of a first opening/closing valve.

The heater 68 is, for example, a spiral heater. The heater 68 is wound around the second supply line 72 and heats the processing fluid in the gas state or the liquid state flowing in the second supply line 72 to generate the processing fluid in the supercritical state. The heater 68 is an example of a heating device.

A drain line 76 is connected to the drain port 37. The drain line 76 is provided with a pressure sensor 242, a valve 213, a flowmeter 251, and a backpressure valve 231 in sequence from the upstream side, that is, the main body 31 side.

The pressure sensor 242 is configured to measure the pressure of the processing fluid flowing in the drain line 76 on the direct downstream side of the main body 31. That is, the pressure sensor 242 is capable of measuring the pressure of the processing fluid within the main body 31. The valve 213 is configured to adjust on and off of the flow of the processing fluid. In the opened state, the valve 213 allows the processing fluid to flow to the drain line 76 on the downstream side, whereas in the closed state, the valve 213 does not allow the processing fluid to flow to the drain line 76 on the downstream side. The flowmeter 251 is configured to measure the flow rate of the processing fluid flowing in the drain line 76.

When the pressure on the primary side of the drain line 76 exceeds a set pressure, the backpressure valve 231 adjusts a valve opening degree to allow the fluid to flow to the secondary side, thus allowing the pressure on the primary side to be maintained at the set pressure. By way of example, the set pressure of the backpressure valve 231 is adjusted by the controller 7 based on the output of the flowmeter 251.

In addition, a temperature sensor 241 configured to detect a temperature of the processing fluid within the main body 31 is provided. An output of the temperature sensor 241 is sent to the controller 7.

In this drying unit 18, the IPA liquid present between patterns formed on the wafer W is brought into contact with the supercritical fluid in a high pressure state (for example, 16 MPa) to be slowly dissolved into the supercritical fluid. As a result, the IPA liquid between the patterns is gradually replaced with the supercritical fluid. Finally, only the supercritical fluid fills in gaps between the patterns.

Then, after the IPA liquid is removed from the gaps between the patterns, an internal pressure of the main body 31 is reduced from the high pressure state to an atmospheric pressure, so that the $CO_2$ is turned into the gas state from the supercritical state, and the gaps between the patterns are occupied only by the gas. In this way, the IPA liquid between the patterns is removed, and the drying processing of the wafer W is completed.

Here, the supercritical fluid has smaller viscosity than a liquid (for example, the IPA liquid), and has high ability to dissolve the liquid. Besides, there exist no interface between the supercritical fluid and a liquid or a gas in equilibrium. Accordingly, in the drying processing using the supercritical fluid, the liquid can be dried without being affected by a surface tension. Thus, according to the exemplary embodiment, pattern collapse can be suppressed when the drying processing is performed.

Further, although the above exemplary embodiment has been described for the example where the IPA liquid is used as a drying prevention liquid and the $CO_2$ in the supercritical state is used as the processing fluid, a liquid other than IPA may be used as the drying prevention liquid, and a fluid other than the $CO_2$ in the supercritical state may be used as the processing fluid. The second supply line 72 constitutes a part of a second fluid supply line.

<Configuration of Supply Unit>

Figure 5:
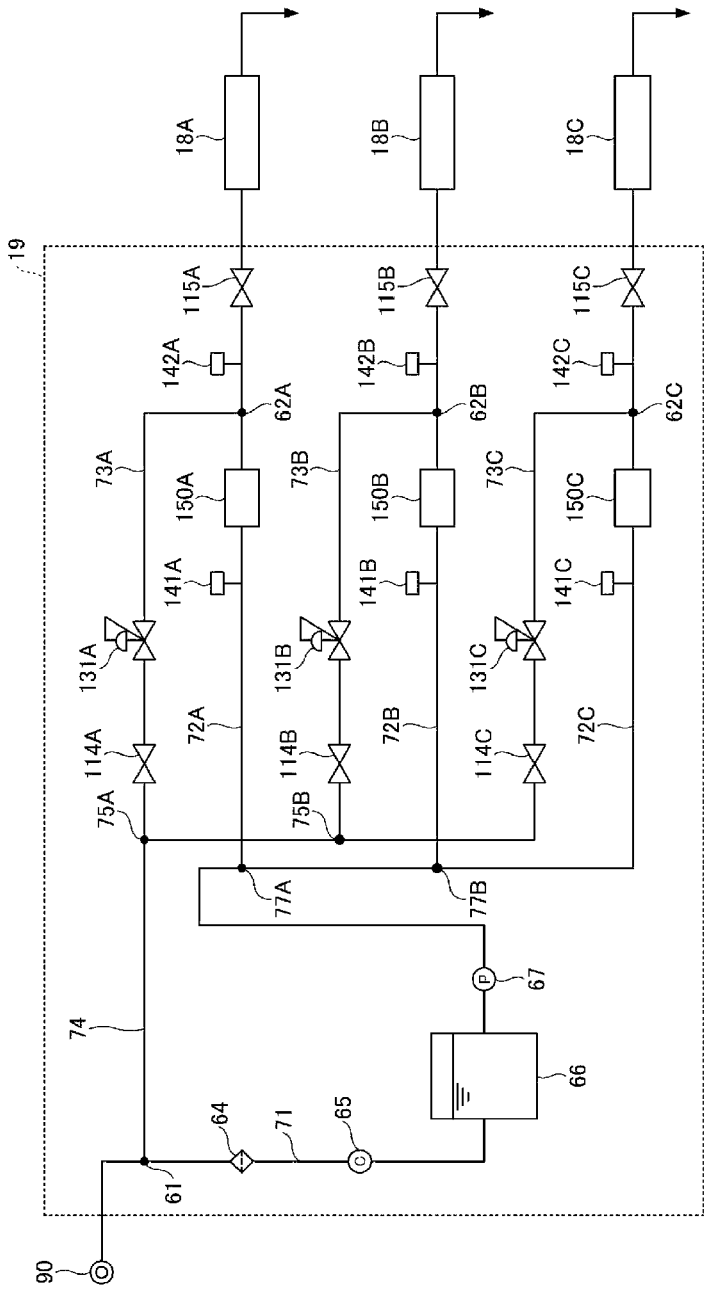
FIG. 5 is a diagram illustrating a configuration example of a supply unit.

Now, the configuration of the supply unit 19 will be described with reference to FIG. 5. FIG. 5 is a diagram illustrating a configuration example of the supply unit 19. The supply unit 19 shown in FIG. 5 respectively supplies the processing fluid to three drying units 18A, 18B and 18C. The drying units 18A to 18C correspond to the drying unit 18 in FIG. 4.

The supply unit 19 has a first supply line 71 connected to a processing fluid source 90 and a plurality of second supply lines 72A, 72B and 72C connected to the first supply line 71. The second supply lines 72A, 72B, and 72C are connected to the first supply line 71 at a multiplicity of branch points 77A and 77B provided on the first supply line 71. Specifically, the second supply line 72A is connected to the first supply line 71 at the branch point 77A, and the second supply lines 72B and 72C are connected to the first supply line 71 at the branch point 77B. The second supply lines 72A to 72C correspond to the second supply line 72 in FIG. 4.

The second supply line 72A is connected to the drying unit 18A; the second supply line 72B is connected to the drying unit 18B; and the second supply line 72C is connected to the drying unit 18C. The processing fluid source 90 is an example of a fluid source. The first supply line 71 is an example of a first fluid supply line, and the second supply lines 72A to 72C constitutes a part of the second fluid supply line.

A connection point 61 is provided on the first supply line 71. The first supply line 71 is provided with a filter 64, a capacitor 65, a tank 66, and a pump 67 in sequence from the upstream side (the processing fluid source 90 side). The connection point 61 is provided upstream of the filter 64.

The filter 64 serves to filter the processing fluid in the gas state flowing in the first supply line 71 to remove a foreign substance contained in the processing fluid. By removing the foreign substance in the processing fluid with this filter 64, it is possible to suppress generation of particles on the surface of the wafer W during the drying processing on the wafer W using the supercritical fluid.

The capacitor 65 is connected to, for example, a non-illustrated cooling water supply, and is capable of exchanging heat between cooling water and the processing fluid in the gas state. Accordingly, the capacitor 65 cools the processing fluid in the gas state flowing in the first supply line 71, and produces the processing fluid in the liquid state. The capacitor 65 is an example of a cooling device.

The tank 66 stores therein the processing fluid in the liquid state generated by the capacitor 65. The pump 67 is configured to feed the processing fluid in the liquid state stored in the tank 66 to the downstream side of the first supply line 71.

In the supply unit 19, the second supply line 72A is provided with a valve 115A; the second supply line 72B, a valve 115B; and the second supply line 72C, a valve 115C. The valves 115A to 115C are configured to adjust on and off of the flow of the processing fluid. In the opened state, the valves 115A to 115C allow the processing fluid to flow to the second supply lines 72A to 72C on the downstream side, respectively. In the closed state, on the other hand, the valves 115A to 115C do not allow the processing fluid to flow to the second supply lines 72A to 72C on the downstream side.

A branch point 62A is provided on the second supply line 72A; a branch point 62B, on the second supply line 72B; and a branch point 62C, on the second supply line 72C. The branch point 62A is provided between the branch point 77A and the valve 115A; the branch point 62B, between the branch point 77B and the valve 115B; and the branch point 62C, between the branch point 77B and the valve 115C. The supply unit 19 includes a first branch line 73A connected to the branch point 62A, a first branch line 73B connected to the branch point 62B, and a first branch line 73C connected to the branch point 62C.

The supply unit 19 also has a second branch line 74 connected to the first branch lines 73A to 73C. The first branch lines 73A to 73C are connected to the second branch line 74 at a plurality of connection points 75A and 75B provided on the second branch line 74. Specifically, the first branch line 73A is connected to the second branch line 74 at the connection point 75A, and the first branch lines 73B and 73C are connected to the second branch line 74 at the connection point 75B. The second branch line 74 is connected to the connection point 61. That is, the second branch line 74 connects the first branch lines 73A to 73C and the connection point 61. Further, the second branch line 74 may not be provided, and the first branch lines 73A to 73C may be directly connected to the first supply line 71 on the upstream side of the filter 64 at separate connection points.

The second supply line 72A is provided with, between the branch point 77A and the branch point 62A, a pressure sensor 141A and a second flow rate adjuster 150A in sequence from the upstream side (the branch point 77A side). The second supply line 72B is provided with, between the branch point 77B and the branch point 62B, a pressure sensor 141B and a second flow rate adjuster 150B in sequence from the upstream side (the branch point 77B side). The second supply line 72C is provided with, between the branch point 77B and the branch point 62C, a pressure sensor 141C and a second flow rate adjuster 150C in sequence from the upstream side (the branch point 77B side). The second flow rate adjuster 150A adjusts the flow rate of the processing fluid flowing in the first branch line 73A; the second flow rate adjuster 150B adjusts the flow rate of the processing fluid flowing in the first branch line 73B; and the second flow rate adjuster 150C adjusts the flow rate of the processing fluid flowing in the first branch line 73C.

Figure 6:
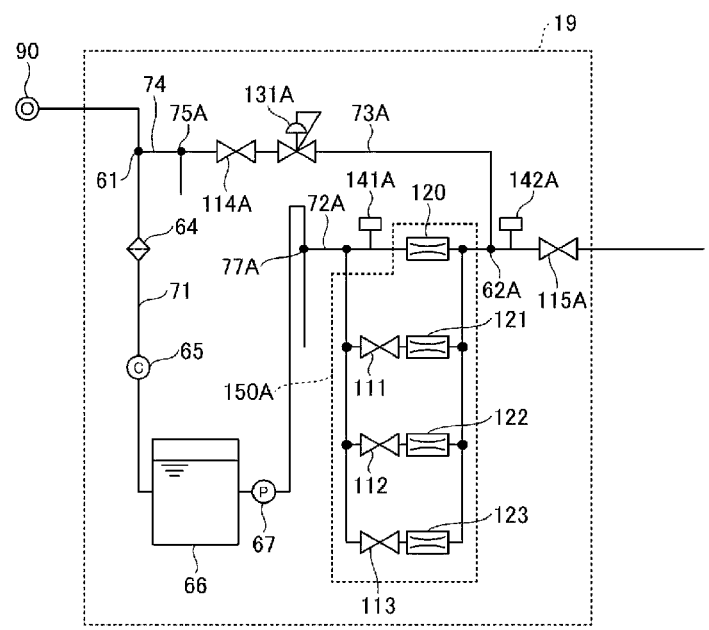
FIG. 6 is a diagram illustrating a configuration example of a second flow rate adjuster and the vicinity thereof.

Here, a configuration of the second flow rate adjusters 150A to 150C will be described. FIG. 6 is a diagram illustrating a configuration example of the second flow rate adjuster 150A and the vicinity thereof.

The second flow rate adjuster 150A includes, as depicted in FIG. 6, an orifice 120, orifices 121, 122 and 123 connected in parallel to the orifice 120, a valve 111 connected in series to the orifice 121, a valve 112 connected in series to the orifice 122, and a valve 113 connected in series to the orifice 123.

The orifices 120 to 123 function to reduce a flow velocity of the processing fluid flowing in the second supply line 72A, thus adjusting the pressure of the processing fluid. The orifices 120 to 123 may allow the pressure-adjusted processing fluid to flow to the second supply line 72A on the downstream side. The orifice 120 is an example of a third diaphragm, and the orifices 121 to 123 are an example of a fourth diaphragm.

The valves 111 to 113 are configured to adjust on and off of the flow of the processing fluid. In the opened state, the valves 111 to 113 allow the processing fluid to flow to the second supply line 72A on the downstream side. In the closed state, on the other hand, the valves 111 to 113 do not allow the processing fluid to flow to the second supply line 72 on the downstream side. The valves 111 to 113 are an example of a second opening/closing valve.

The second flow rate adjusters 150B and 150C have the same configuration as the second flow rate adjuster 150A.

Here, a basic operation of the supply unit 19 will be described.

The gaseous processing fluid supplied from the processing fluid source 90 to the first supply line 71 is sent to the capacitor 65 through the filter 64, and is liquefied by being cooled by the capacitor 65. The liquefied processing fluid is stored in the tank 66. The liquid processing fluid stored in the tank 66 becomes a high-pressure fluid by the pump 67, and a part of this high-pressure fluid is supplied to the drying units 18A to 18C. The high-pressure fluid supplied to the drying units 18A to 18C is turned into a supercritical state by the heater 68 to be used for drying. Further, another part of the high-pressure fluid flows into the first branch lines 73A to 73C and returns to the first supply line 71 from the connection point 61. In this way, the processing fluid is circulated in the supply unit 19.

<Specific Operations of Supply Unit and Drying Unit>

Now, specific operations of the supply unit 19 and the drying unit 18 will be discussed.

Hereinafter, the specific operations of the supply unit 19 and the drying unit 18A will be described based on a drying method (substrate processing method) performed by using the drying unit 18A. FIG. 7 to FIG. 13 are diagrams showing the specific operations of the supply unit 19 and the drying unit 18A. FIG. 7 to FIG. 13 show, as an example, specific operations of the supply unit 19 when the processing fluid is supplied to the drying unit 18A. During the operations shown in FIG. 7 to FIG. 13, the pump 67 continues to operate. As shown in FIG. 7 to FIG. 13, a processing fluid supply 80 includes the supply unit 19, and the valve 211, the first flow rate adjuster 250 and the heater 68 within the drying unit 18.

<Standby Process>

Figure 7:
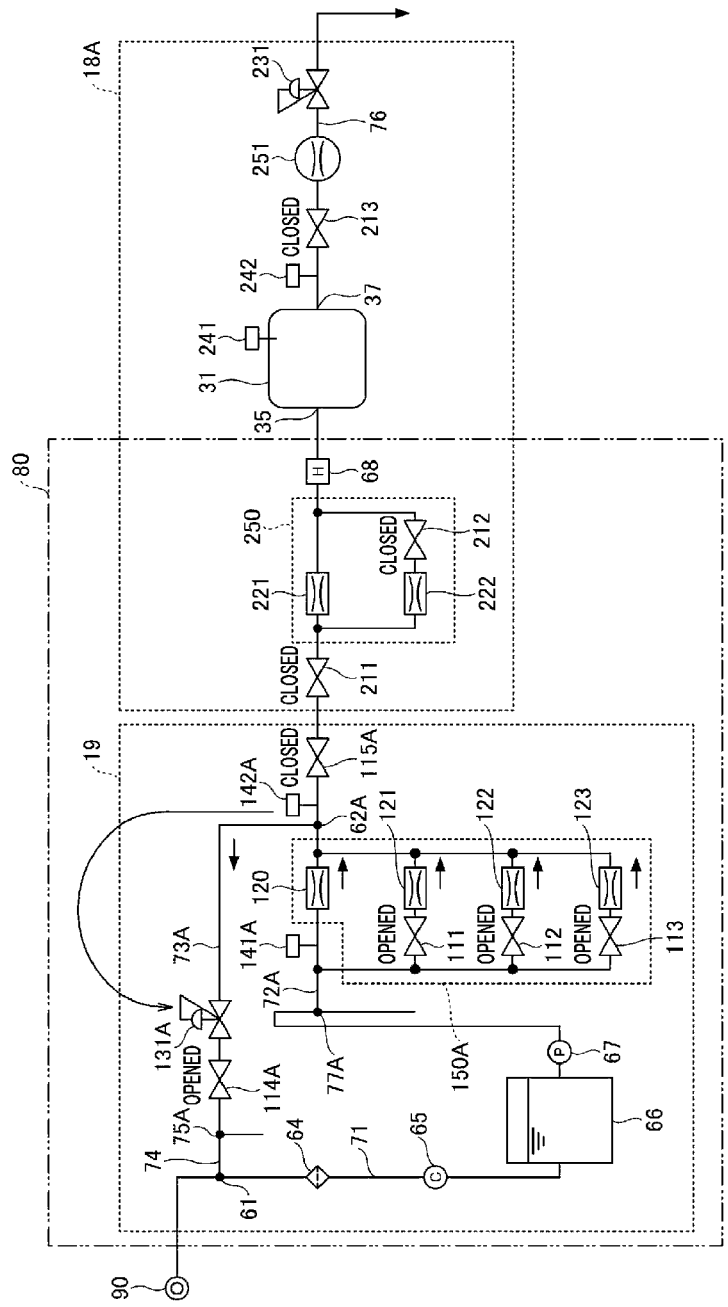
FIG. 7 is a first diagram illustrating specific operations of the supply unit and the drying unit.

A standby process is a process of waiting for the supply of the processing fluid after the wafer W is transferred into the drying unit 18A. In the standby process, the valves 111 to 113 are opened, as shown in FIG. 7. Further, the valve 114A is opened, and the valve 115A is closed. The processing fluid guided to the second supply line 72A reaches the branch point 62A via the orifice 120 and via the orifices 121 to 123, and then flows into the first branch line 73A. The processing fluid guided into the first branch line 73A arrives at the connection point 61 via the backpressure valve 131A, the valve 114A and the second branch line 74, and returns to the tank 66 via the filter 64 and the capacitor 65.

During these series of operations, the controller 7 receives an output from the pressure sensor 142A, and adjusts a set pressure of the backpressure valve 131A such that the pressure of the processing fluid flowing downstream of the orifice 120 of the second supply line 72A becomes a preset pressure (e.g., 19.0 MPa). That is, the controller 7 controls the pressure of the processing fluid at the branch point 62A by changing an amount of the processing fluid flown into the first branch line 73A.

In the standby process, the processing fluid is not supplied from the processing fluid source 90, and the processing fluid circulates in the supply unit 19. At this time, since the valves 111 to 113 are in the opened state, it is difficult for the processing fluid to stay in the second flow rate adjuster 150A, so that generation of particles accompanying the retention of the processing fluid can be suppressed.

<Pressure Increasing Process>

After the standby process, a pressure increasing process is performed. The pressure increasing process is a process of increasing the internal pressure of the main body 31. In the pressure increasing process, the processing fluid in the supercritical state is first supplied into the main body 31 at a first flow rate to increase the internal pressure. Then, the processing fluid in the supercritical state is supplied into the main body 31 at a second flow rate larger than the first flow rate to further increase the internal pressure. That is, the pressure increasing is performed in two stages.

Figure 8:
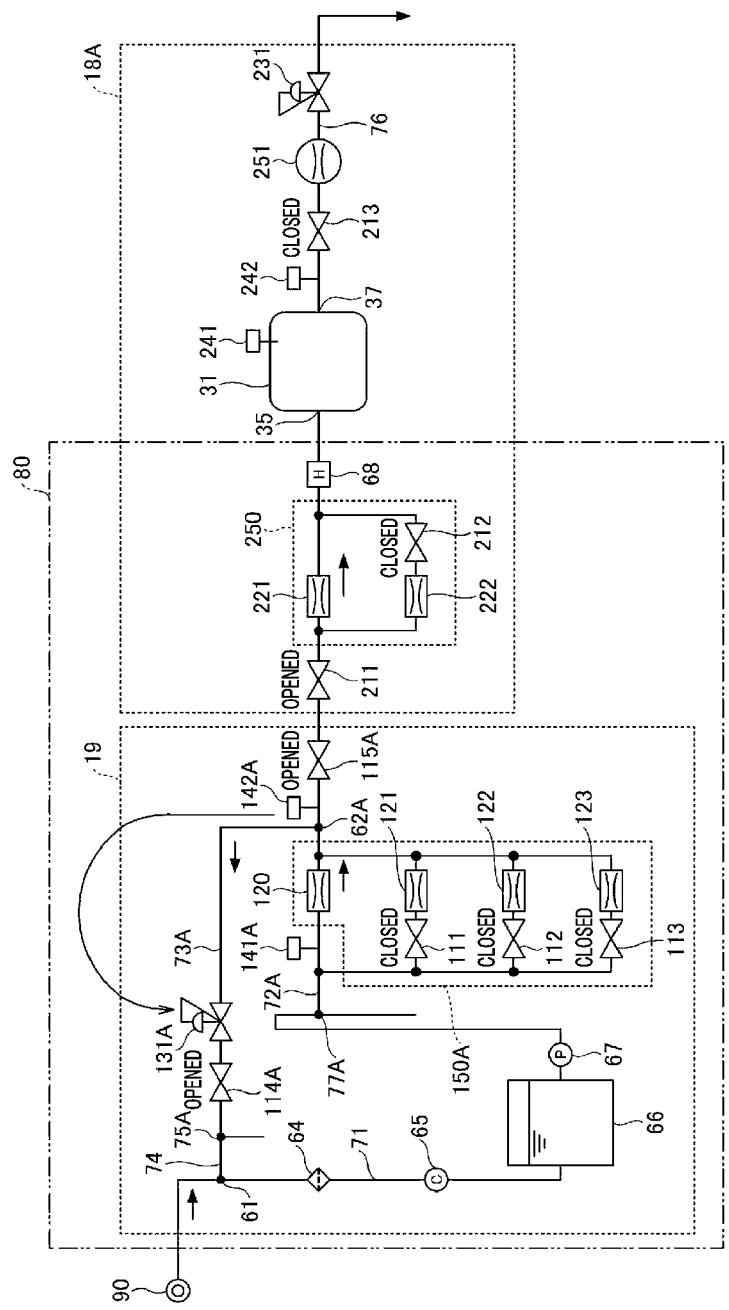
FIG. 8 is a second diagram illustrating specific operations of the supply unit and the drying unit.

In the pressure increasing with the first flow rate, the valves 111 to 113 are closed, as shown in FIG. 8. Further, the valves 114A and 115A are opened. The processing fluid guided into the second supply line 72A arrives at the branch point 62A via the single orifice 120 without passing through the three orifices 121 to 123.

A part of the processing fluid having reached the branch point 62A passes through the valve 115A to be supplied to the drying unit 18A, and another part of the processing fluid flows from the branch point 62A to the first branch line 73A. The processing fluid introduced into the first branch line 73A reaches the connection point 61 via the backpressure valve 131A, the valve 114A and the second branch line 74, and returns back into the tank 66 via the filter 64 and the capacitor 65.

During these series of operations, the controller 7 receives the output from the pressure sensor 142A, and adjusts the pressure of the backpressure valve 131 such that the pressure of the processing fluid flowing downstream of the orifice 120 of the second supply line 72A becomes a preset pressure (e.g., 7.0 MPa). That is, the controller 7 controls the pressure of the processing fluid at the branch point 62A by changing the amount of the processing fluid flown to the first branch line 73A.

Further, in the drying unit 18A, the valve 211 is opened, and the valves 212 and 213 are closed. Accordingly, the processing fluid supplied to the drying unit 18A reaches the heater 68 via the orifice 221 without passing through the orifice 222, and is heated by the heater 68 to be turned into the supercritical state. Then, the processing fluid in the supercritical state is supplied to the main body 31 at the first flow rate. The internal pressure of the main body 31 into which the processing fluid in the supercritical state is supplied rises gradually from 0 MPa. In the pressure increasing with the first flow rate, since the pressure of the processing fluid at the branch point 62A is maintained at the preset pressure, a supply pressure of the processing fluid in the supercritical state into the main body 31 is also maintained constant.

During the pressure increasing with the first flow rate, the controller 7 receives an output from the pressure sensor 242. If the internal pressure of the main body 31 reaches a preset pressure (e.g., 5.0 MPa), the pressure increasing with the second flow rate is begun.

Figure 9:
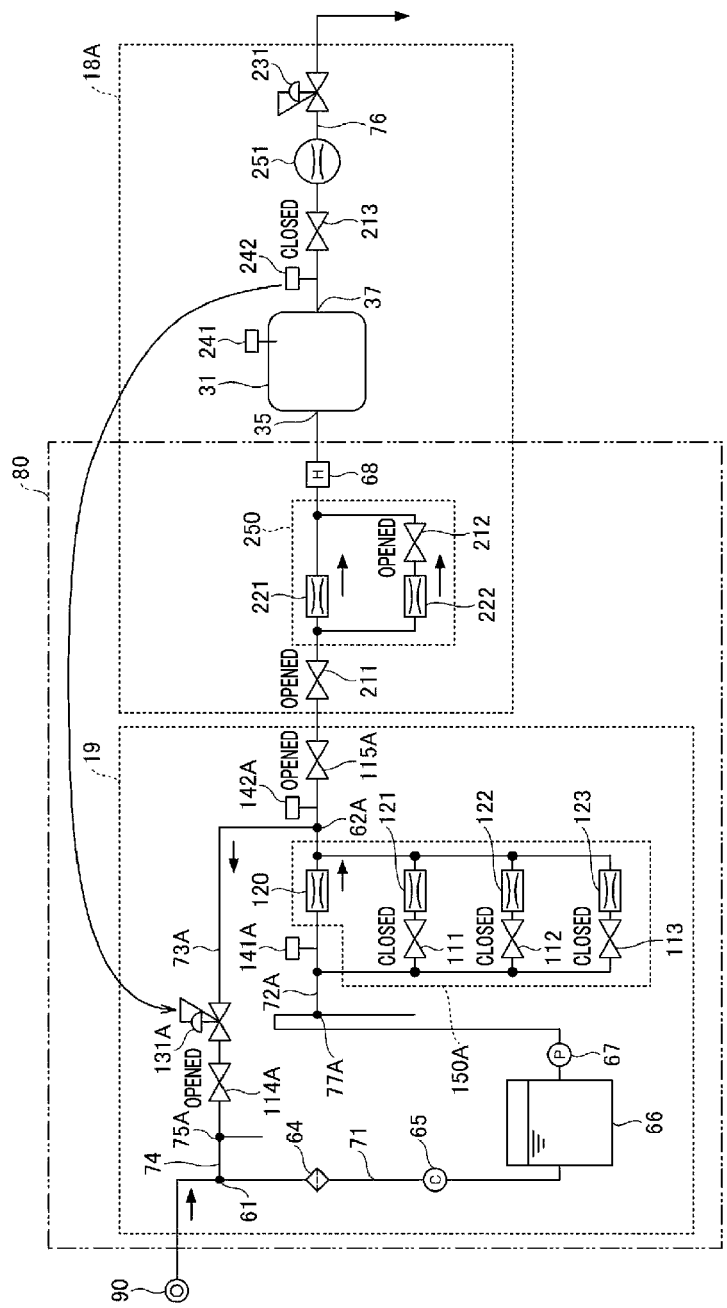
FIG. 9 is a third diagram illustrating specific operations of the supply unit and the drying unit.

In the pressure increasing with the second flow rate, the valve 212 is first opened, as shown in FIG. 9. States of the other valves are the same as those shown in FIG. 8. As a result, the processing fluid supplied to the drying unit 18A reaches the heater 68 via not only the orifice 221 but also the orifice 222, and is heated by the heater 68 to be turned into the supercritical state. Accordingly, the flow rate of the processing fluid in the supercritical state supplied to the main body 31 increases to the second flow rate.

During these series of operations, the controller 7 receives the output from the pressure sensor 242 and adjusts the set pressure of the backpressure valve 131A so that the internal pressure of the main body 31 gradually increases with a predetermined gradient. That is, the controller 7 controls the pressure of the processing fluid at the branch point 62A by changing the amount of the processing fluid flown to the first branch line 73A. Since the pressure of the processing fluid at the branch point 62A gradually increases, the supply pressure of the processing fluid in the supercritical state into the main body 31 also increases gradually.

Figure 10:
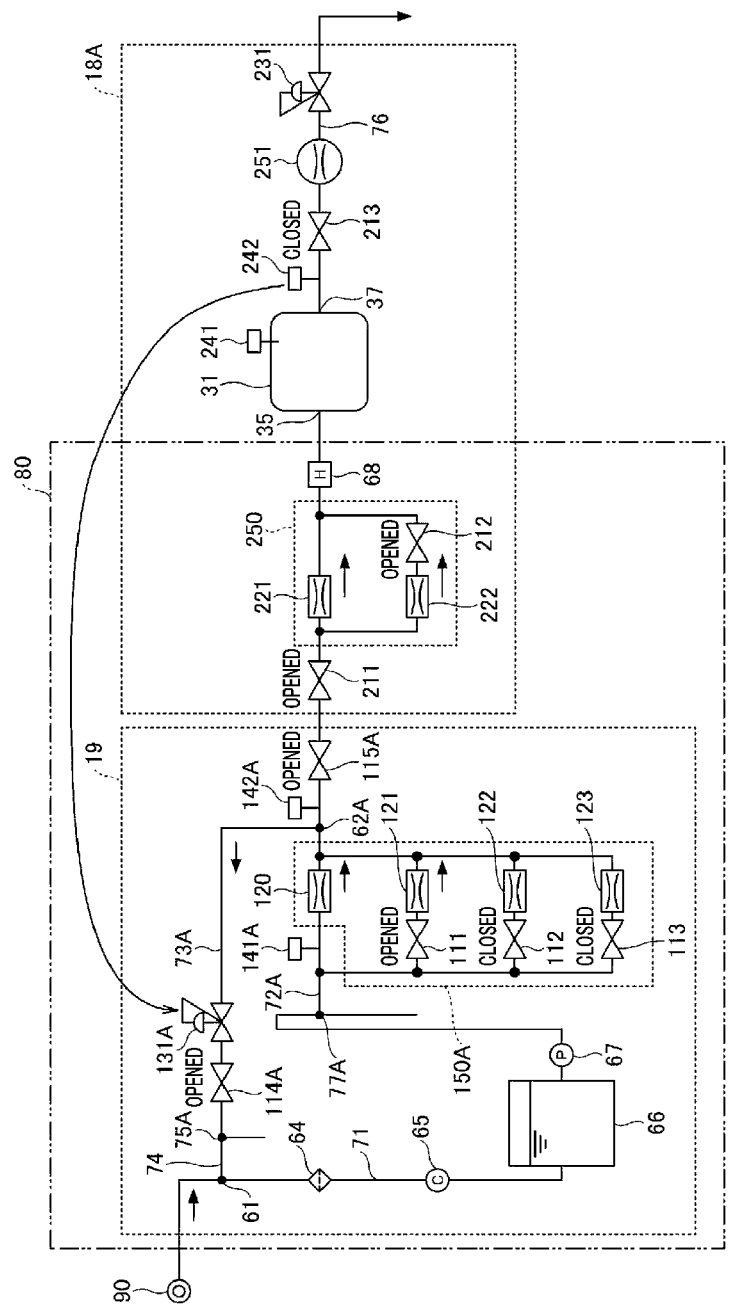
FIG. 10 is a fourth diagram illustrating specific operations of the supply unit and the drying unit.

In the pressure increasing with the second flow rate, as the pressure of the processing fluid at the branch point 62A increases, a pressure difference between the upstream side and the downstream side of the orifice 120 is reduced. Accordingly, if the pressure of the processing fluid at the branch point 62A reaches a predetermined pressure (e.g., 11.0 MPa), the controller 7 turns the valve 111 into an opened state, as shown in FIG. 10. The states of the other valves are the same as those shown in FIG. 9. As a result, even if the pressure difference between the upstream side and the downstream side of the orifice 120 is reduced, the processing fluid can still be flown to the first branch line 73A and the second branch line 74. During this period, the internal pressure of the main body 31 rises from 5.0 MPa to 13.0 MPa, for example.

Figure 11:
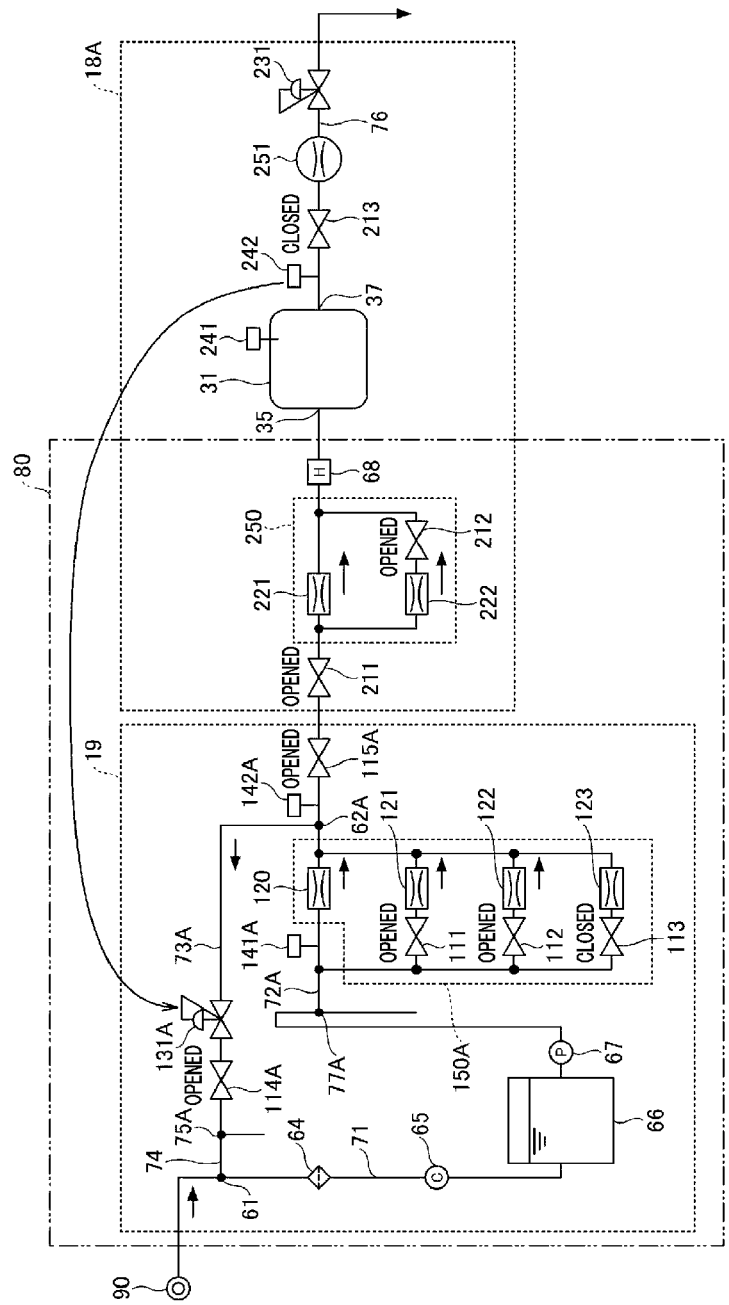
FIG. 11 is a fifth diagram illustrating specific operations of the supply unit and the drying unit.

If the pressure of the processing fluid at the branch point 62A reaches a higher preset pressure (e.g., 14.5 MPa), the controller 7 opens the valve 112 as well, as illustrated in FIG. 11. The states of the other valves are the same as those shown in FIG. 10. As a result, even if the pressure difference between the upstream side and the downstream side of the orifice 120 is further reduced, the processing fluid can still be flown to the first branch line 73A and the second branch line 74. During this period, the internal pressure of the main body 31 rises from 13.0 MPa to 15.0 MPa, for example.

Figure 12:
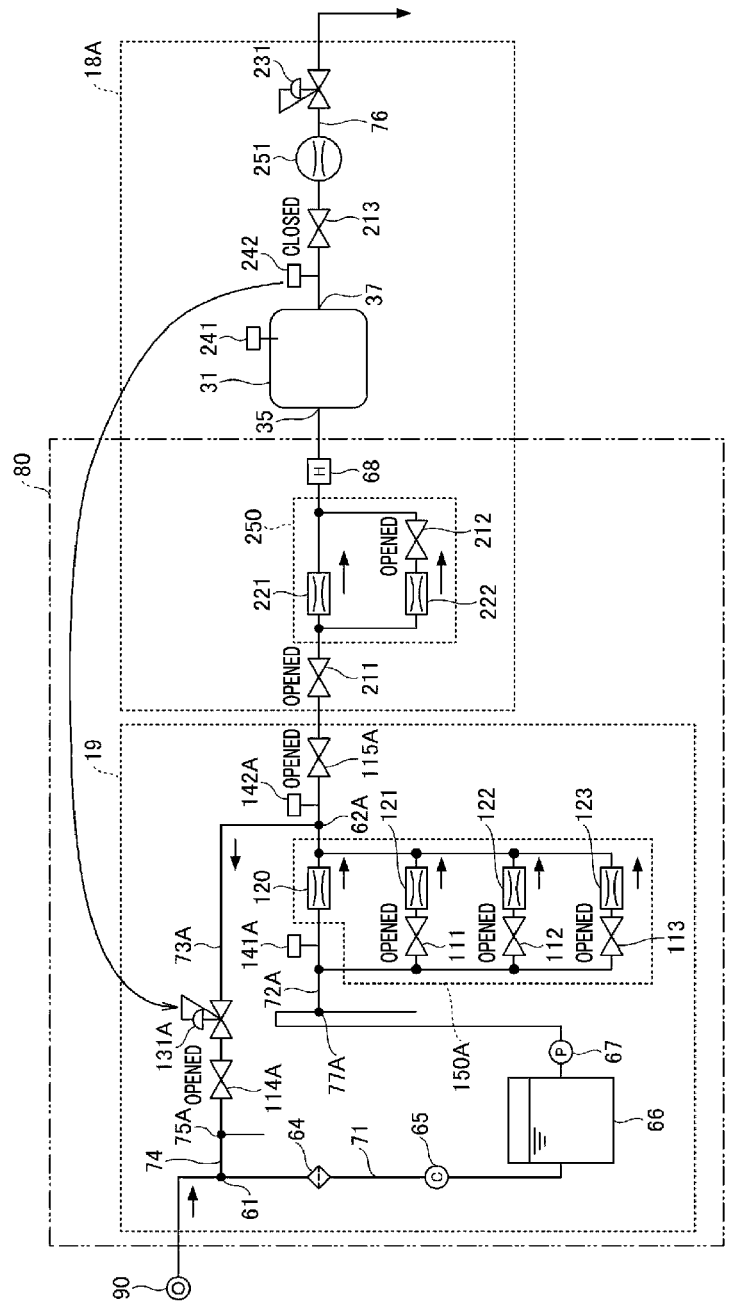
FIG. 12 is a sixth diagram illustrating specific operations of the supply unit and the drying unit.

If the pressure of the processing fluid at the branch point 62A reaches a further higher preset pressure (for example, 17.0 MPa), the controller 7 opens the valve 113 as well, as shown in FIG. 12. The states of the other valves are the same as those shown in FIG. 11. As a result, even if the pressure difference between the upstream side and the downstream side of the orifice 120 is further reduced, the processing fluid can still be flown to the first branch line 73A and the second branch line 74. During this period, the internal pressure of the main body 31 increases from 15.0 MPa to 16.0 MPa, for example.

In this way, the pressure increasing process is carried out.

<Flowing Process>

Figure 13:
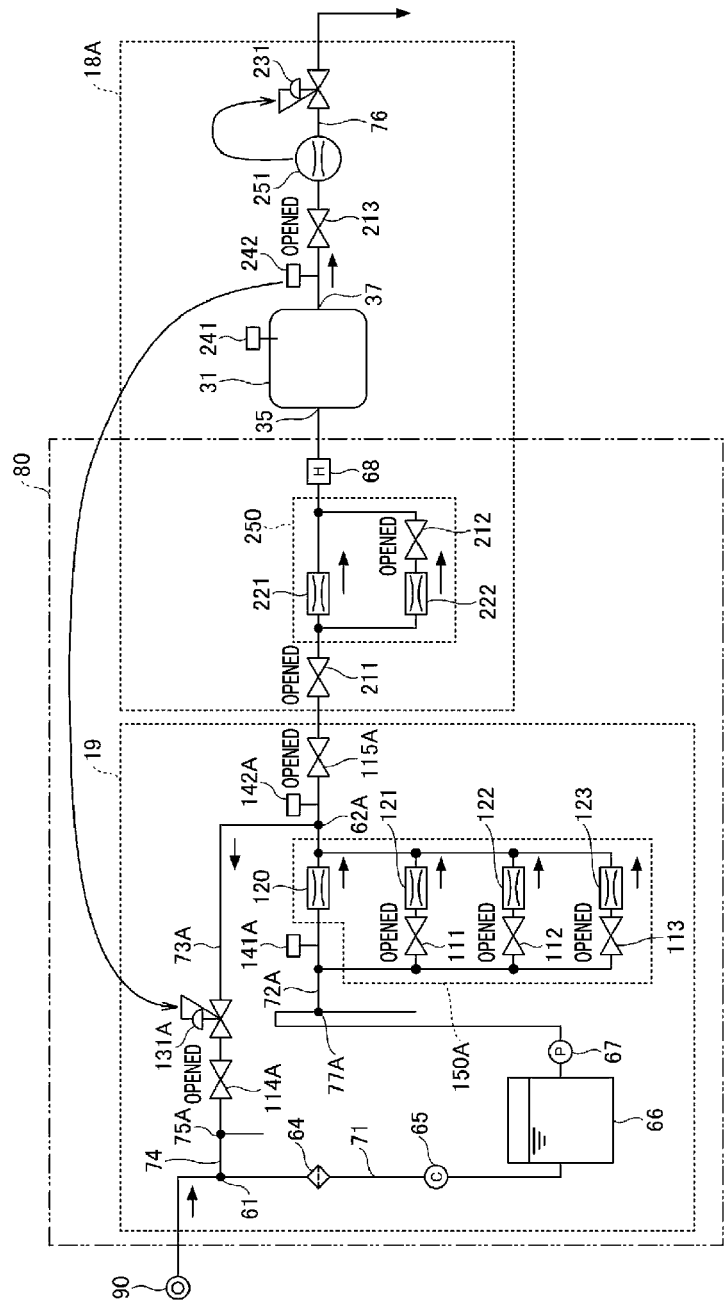
FIG. 13 is a seventh diagram illustrating specific operations of the supply unit and the drying unit.

A flowing process is performed after the pressure increasing process. The flowing process is a process in which the liquid film of the IPA liquid on the wafer W transferred into the main body 31 is dried by using the processing fluid in the supercritical state. In the flowing process, the valves 111 to 113 are opened, as shown in FIG. 13. Further, the valves 114A and 115A are also opened. The processing fluid guided into the second supply line 72A reaches the branch point 62A via the four orifices 120 to 123.

A part of the processing fluid having reached the branch point 62A is supplied to the drying unit 18A through the valve 115A, and another part of the processing fluid flows from the branch point 62A to the first branch line 73A. The processing fluid guided into the first branch line 73A arrives at the connection point 61 via the backpressure valve 131A, the valve 114A and the second branch line 74, and returns to the tank 66 via the filter 64 and the capacitor 65.

Further, in the drying unit 18A, the valves 211 to 213 are opened. Accordingly, the processing fluid flows into the second supply line 72A and is supplied from the supply port 35 into the main body 31. Further, the processing fluid flows through the drain line 76 from the drain port 37 of the main body 31, and is drained to the outside through the valve 213, the flowmeter 251 and the backpressure valve 231.

During these series of operations, the controller 7 receives the output from the pressure sensor 242, and adjusts the set pressure of the backpressure valve 131A so that the internal pressure of the main body 31 is maintained at a set pressure for the flowing process. In addition, the controller 7 receives an output of the flowmeter 251 and adjusts the set pressure of the backpressure valve 231 so that the flow rate of the processing fluid flowing in the drain line 76 becomes a predetermined flow rate.

<Draining Process>

A draining process is performed after the flowing process. The draining process is a process in which the processing fluid is drained from the main body 31. In the draining process, the valves 115A and 211 are closed. The states of the other valves are the same as those shown in FIG. 13. If the internal pressure of the main body 31 becomes lower than the threshold pressure of the processing fluid by the draining process, the processing fluid in the supercritical state is vaporized to be escaped from the inside of the recess of the pattern. Accordingly, the drying processing upon the single wafer W is completed.

When the processing fluid is supplied to the drying units 18B and 18C, control over the valves 111 to 113, the valve 212, and the like is performed, the same as in the case where the processing fluid is supplied to the drying unit 18A.

As described above, in the substrate processing apparatus 1 equipped with the first flow rate adjuster 250, the flow rate of the processing fluid in the supercritical state supplied into the main body 31 in the pressure increasing process can be adjusted. For example, the processing fluid may be supplied at the smaller first flow rate, and then supplied at the larger second flow rate. The wafer W carried into the main body 31 may have fine patterns formed on the surface thereof. In that case, if the processing fluid is supplied at a larger flow rate, there is a risk that the pattern may collapse. As a resolution, by supplying the processing fluid at the first flow rate before supplying it at the second flow rate, the processing fluid in the supercritical state can be diffused between the patterns while pattern collapse is suppressed, so that the pattern collapse can also be suppressed during the subsequent supply of the processing fluid at the second flow rate. In addition, since the processing fluid can be supplied at the second flow rate larger than the first flow rate, the time required for the pressure increasing can be shortened by supplying the processing fluid at the second flow rate after the processing fluid in the supercritical state is diffused between the patterns.

Further, in the substrate processing apparatus 1, the heater 68 is provided on the downstream side (the main body 31 side) of the first flow rate adjuster 250. For this reason, the temperature of the processing fluid in the supercritical state at the time when it is supplied into the main body 31 can be easily stabilized. In particular, high temperature uniformity can be achieved among the plurality of drying units 18A to 18C.

In addition, since the supply unit 19 is provided with the second flow rate adjusters 150A to 150C, it is possible to stabilize the flow rate (circulation flow rate) of the processing fluid circulated through the first branch lines 73A to 73C. For example, in the pressure increasing with the first flow rate, since the internal pressure of the main body 31 is low, the pressure of the processing fluid at the branch point 62A is also low, which results in an increase of a pressure difference between the upstream side and the downstream side of the orifice 120. In this case as well, in the present exemplary embodiment, the circulation flow rate is reduced by closing the valves 111 to 113, so that a load on the pump 67 can be reduced. Further, in the pressure increasing with the second flow rate, by appropriately opening the valves 111 to 113 based on the pressure difference between the upstream side and the downstream side of the orifice 120, the processing fluid can be continuously flown to the first branch line 73A and the second branch line 74.

Furthermore, a trigger for the transition from the pressure increasing with the first flow rate to the pressure increasing with the second flow rate is not limited to the output of the pressure sensor 242. By way of example, an elapsed time of the pressure increasing with the first flow rate may be used as the trigger.

So far, the exemplary embodiment has been described. However, the exemplary embodiment is not limiting, and various modifications and replacements may be made without departing from the scope of the present disclosure as claimed in the following claims.

By way of example, the processing fluid used for the drying processing may be a fluid other than the $CO_2$ (for example, a fluorine-based fluid), or any fluid capable of removing the drying prevention liquid accumulated on the substrate while being in a supercritical state may be used as the processing fluid. Moreover, the drying prevention liquid is not limited to the IPA, either. Any of various liquids available as the drying prevention liquid may be used. The substrate as the processing target is not limited to the aforementioned semiconductor wafer W, and any of various other types of substrates such as a glass substrate for LCD and a ceramic substrate may be used.

According to the exemplary embodiment, it is possible to suppress the collapse of the pattern of the wafer in the drying processing using the processing fluid in the supercritical state.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a processing vessel having a processing space in which a substrate whose surface is wet by a liquid is allowed to be accommodated; and
a processing fluid supply configured to supply a processing fluid in a supercritical state into the processing vessel toward the liquid,
wherein the processing fluid supply comprises:
a fluid supply line having a first end connected to a fluid source and a second end connected to the processing vessel;
a cooling device provided in the fluid supply line, and configured to cool the processing fluid in a gas state to produce the processing fluid in a liquid state;
a pump provided in the fluid supply line to be positioned downstream of the cooling device;
a heating device provided in the fluid supply line to be positioned downstream of the pump, and configured to heat the processing fluid in the liquid state to generate the processing fluid in the supercritical state;
a first flow rate adjuster provided in the fluid supply line to be positioned between the pump and the heating device, and configured to adjust a supply flow rate of the processing fluid supplied to the processing vessel;
a controller configured to control the first flow rate adjuster;
a branch point provided between the pump and the first flow rate adjuster in the fluid supply line;
a connection point provided upstream of the cooling device in the fluid supply line;
a branch line connecting the branch point and the connection point; and
a second flow rate adjuster provided in the fluid supply line, and configured to adjust a flow rate of the processing fluid flowing in the branch line,
wherein the second flow rate adjuster comprises:
a first diaphragm and a second diaphragm provided in the fluid supply line while being connected in parallel to each other; and
a first opening/closing valve connected in series to the second diaphragm.

2. The substrate processing apparatus of claim 1,
wherein the controller increases an internal pressure of the processing vessel by setting the supply flow rate to a first flow rate, and then further increases the internal pressure of the processing vessel by setting the supply flow rate to a second flow rate larger than the first flow rate.

3. The substrate processing apparatus of claim 2,
wherein the controller sets the supply flow rate to be the first flow rate until the internal pressure of the processing vessel reaches a first pressure, and then sets the supply flow rate to be the second flow rate when the internal pressure of the processing vessel reaches the first pressure.

4. The substrate processing apparatus of claim 1,
wherein the first flow rate adjuster comprises:
a third diaphragm and a fourth diaphragm provided in the fluid supply line while being connected in parallel to each other; and
a second opening/closing valve connected in series to the fourth diaphragm.

5. The substrate processing apparatus of claim 1,
wherein the processing fluid is in the gas state or in the liquid state between the pump and the heating device.

6. The substrate processing apparatus of claim 1,
wherein the controller controls the first opening/closing valve based on a pressure difference between an upstream side and a downstream side of the first diaphragm.

7. The substrate processing apparatus of claim 1,
wherein multiple sets of the second diaphragm and the first opening/closing valve are provided in the second flow rate adjuster.

8. A substrate processing apparatus, comprising:
a processing vessel having a processing space in which a substrate whose surface is wet by a liquid is allowed to be accommodated; and
a processing fluid supply configured to supply a processing fluid in a supercritical state into the processing vessel toward the liquid,
wherein the processing fluid supply comprises:
a fluid supply line having a first end connected to a fluid source and a second end connected to the processing vessel;
a cooling device provided in the fluid supply line, and configured to cool the processing fluid in a gas state to produce the processing fluid in a liquid state;
a pump provided in the fluid supply line to be positioned downstream of the cooling device;
a heating device provided in the fluid supply line to be positioned downstream of the pump, and configured to heat the processing fluid in the liquid state to generate the processing fluid in the supercritical state;
a first flow rate adjuster provided in the fluid supply line to be positioned between the pump and the heating device, and configured to adjust a supply flow rate of the processing fluid supplied to the processing vessel; and
a controller configured to control the first flow rate adjuster,
wherein the processing vessel includes multiple processing vessels, the fluid supply line includes a first fluid supply line provided with the cooling device and the pump, and multiple second fluid supply lines each of which is connected between the first fluid supply line and corresponding one of the multiple processing vessels, and the heating device and the first flow rate adjuster are provided in each of the multiple second fluid supply lines.

9. A substrate processing method performed in a substrate processing apparatus,
wherein the substrate processing apparatus comprises:
a processing vessel having a processing space in which a substrate whose surface is wet by a liquid is allowed to be accommodated; and
a processing fluid supply configured to supply a processing fluid in a supercritical state into the processing vessel toward the liquid,
wherein the processing fluid supply comprises:
a fluid supply line having a first end connected to a fluid source and a second end connected to the processing vessel;
a cooling device provided in the fluid supply line, and configured to cool the processing fluid in a gas state to produce the processing fluid in a liquid state;
a pump provided in the fluid supply line to be positioned downstream of the cooling device;
a heating device provided in the fluid supply line to be positioned downstream of the pump, and configured to heat the processing fluid in the liquid state to generate the processing fluid in the supercritical state;
a first flow rate adjuster provided in the fluid supply line to be positioned between the pump and the heating device, and configured to adjust a supply flow rate of the processing fluid supplied to the processing vessel;
a branch point provided between the pump and the first flow rate adjuster in the fluid supply line;
a connection point provided upstream of the cooling device in the fluid supply line;
a branch line connecting the branch point and the connection point; and
a second flow rate adjuster provided in the fluid supply line, and configured to adjust a flow rate of the processing fluid flowing in the branch line,
wherein the second flow rate adjuster comprises:
a first diaphragm and a second diaphragm provided in the fluid supply line while being connected in parallel to each other; and
a first opening/closing valve connected in series to the second diaphragm, and
wherein the substrate processing method comprises:
increasing an internal pressure of the processing vessel by controlling the first flow rate adjuster to set the supply flow rate to be a first flow rate; and
further increasing the internal pressure of the processing vessel by controlling the first flow rate adjuster to set the supply flow rate to be a second flow rate larger than the first flow rate.

* * * * *